United States Patent [19]
Larson

[11] Patent Number: 5,160,579
[45] Date of Patent: Nov. 3, 1992

[54] PROCESS FOR MANUFACTURING PRINTED CIRCUIT EMPLOYING SELECTIVE PROVISION OF SOLDERABLE COATING

[75] Inventor: Gary B. Larson, Cheshire, Conn.

[73] Assignee: MacDermid, Incorporated, Waterbury, Conn.

[21] Appl. No.: 710,779

[22] Filed: Jun. 5, 1991

[51] Int. Cl.$^5$ .................. B44C 1/22; C23F 1/00
[52] U.S. Cl. ........................... 156/661.1; 29/852; 156/645; 156/656; 156/902; 427/97; 430/314; 205/126
[58] Field of Search ............... 156/629-634, 156/644, 645, 655, 656, 659.1, 661.1, 902; 427/96, 97, 98; 29/846, 852; 430/313, 314; 204/180.1, 181.1, 15, 32.1, 38.4

[56] References Cited

U.S. PATENT DOCUMENTS

| | | | |
|---|---|---|---|
| 3,892,646 | 7/1975 | Lazzarini et al. | 204/181 |
| 4,325,780 | 4/1982 | Schulz | 156/659.1 |
| 4,487,654 | 12/1984 | Coppin | 156/645 |
| 4,592,816 | 6/1986 | Emmons et al. | 204/180.6 |
| 4,746,399 | 5/1988 | Demmer et al. | 156/656 |
| 4,751,172 | 6/1988 | Rodriguez et al. | 430/314 |
| 4,804,615 | 2/1989 | Larson et al. | 430/314 |
| 4,861,438 | 8/1989 | Banks et al. | 204/15 |
| 4,978,423 | 10/1990 | Durnwith | 156/659.1 |

FOREIGN PATENT DOCUMENTS

| | | |
|---|---|---|
| 2422732 | 9/1979 | France . |
| 293312 | 5/1971 | U.S.S.R. . |
| 1194826 | 6/1970 | United Kingdom . |

Primary Examiner—William A. Powell
Attorney, Agent, or Firm—St. Onge, Steward, Johnston & Reens

[57] ABSTRACT

The areas of a printed circuit where electrical components are to be solder connected, such as throughholes, surrounding pads and surface mount areas, are selectively provided with a metal coating (e.g., tin-lead) which preserves and promotes solderability thereat, by a process in which a photoimageable electrophoretically deposited organic resin is used to provide, on an already patterned surface, an additional resist pattern which selectively exposes areas on which the solderable metal coating is to be provided and in which the resist serves also as an etch resist for metal areas over which it is arranged.

9 Claims, 3 Drawing Sheets

PROCESS FOR MANUFACTURING PRINTED CIRCUIT EMPLOYING SELECTIVE PROVISION OF SOLDERABLE COATING

BACKGROUND OF THE INVENTION

The present invention relates to the manufacture of printed circuits and, more particularly, to the manufacture of printed circuits wherein a solderable coating is selectively applied to particular desired areas of the circuit.

In the fabrication of printed circuits, it is well known to provide the circuit, at those locations such as through-holes, pads and surface mount areas at which electrical components such as transistors, capacitors, integrated circuits, and the like will later be connected via soldering, with a metal coating which promotes and preserves ready solderability of those areas. Typically, the metal coating so provided is solder itself. In addition, other areas of the circuit at which soldered connections will not later be made, and which are to be protected in the subsequent solder connection operation, are masked.

There are a number of processes for arriving at the desired pattern of solder-bearing and solder-masked areas on the printed circuit. In a typical process, a printed circuit laminate (e.g., a double sided printed circuit or a multilayer circuit having copper foil clad outer surfaces) has through holes drilled therein which are then metallized via electroless copper depositing (at the same time providing electroless copper over the copper foil cladding). A plating resist pattern is then applied by selective exposure and development of a photoresist, the pattern being in the negative of the eventually desired conductive circuitry. Thereafter, copper thickness is built up at those areas not covered by the plating resist, typically by electrolytic copper plating. The built up copper areas are then overplated with electrolytic tin-lead to serve as an etch resist, the plating resist then removed, and the copper which was under the plating resist then etched away down to the substrate surface.

At this stage in the process, a number of different variations are possible for providing the ultimately desired solderable holes, pads and surface mount areas. For example, all areas of the board other than through-holes, pads and surface mount areas might at this point be covered with a solder mask, and then the tin-lead coating over the non-masked areas reflowed and fused to provide the requisite solder surface thereon. Generally, however, processing in this manner is not preferred because during the reflow and fusing, as well as during later connection of electrical devices via wave or dip soldering, the tin-lead coating on the copper traces under the solder mask tends also to reflow. This can result in the production of solder slivers, causing shorts between adjacent traces, and also can result in an aesthetically undesirable crinkled solder mask surface. One means to avoid this problem is to arrange that there be no reflowable metal under the solder mask, e.g., that any metal areas under the solder mask be bare copper surfaces (so-called SMOBC processes). Thus, after the copper etching step, the tin-lead etch resist is completely stripped, the areas other than holes, pads and surface mount areas then solder masked (the mask thus being over bare copper traces), and solder then applied to the exposed copper through-holes, pads, etc. by immersion tin-lead plating (followed by reflow and fusing) or, more typically, hot air solder leveling application.

Other techniques along these lines are known, such as the use of organic etch resists over tin-lead plated through-holes, pads, etc., followed by selective stripping of tin-lead from copper traces before application of solder mask. See U.S. Pat. No. 4,978,423 to Durnwith, Jr., et al. See also U.S. Pat. No. 4,325,780 to Schulz, Sr.; U.S. Pat. No. 4,487,654 to Coppin; and U.S Pat. No. 4,804,615 to Larson, et al for other known selective solder and solder masking processes which involve the use of multiple plating resists in attempts to only selectively provide tin-lead at desired locations.

In most of these known processes, then, for providing solder at desired hole, pad and surface mount locations, and for providing solder mask over bare copper traces, there is involved application of tin-lead to areas from which the tin-lead eventually is completely or selectively etched. This manner of processing involves wasteful use of tin-lead, adds tin-lead stripping requirements to the overall process, and requires processing of stripped tin-lead. In those other known processes which attempt to selectively provide tin-lead initially only to the areas eventually requiring solder coating, the foregoing problems are resolved but other problems are introduced in terms of the increased number of steps and expense in applying and then removing copper plating resists prior to application of the tin-lead plating resists which enable selective tin-lead plating, and/or in applying resists over existing resists and the problems attendant with imaging and exposure in such situations.

It is the primary object of the present invention to provide a process which eliminates problems of the type above-described.

SUMMARY OF THE INVENTION

According to the present invention, there is provided a process for selectively applying a solderable coating, such as a reflowable tin-lead coating, to those areas of the printed circuit, e.g., holes, pads and surface mount areas, at which a solderable coating is desired, without need for application of the coating to areas (e.g., traces) where it subsequently requires stripping so that solder mask can be applied over bare copper. In this way, and with specific reference to tin-lead coatings, there is a conserving of tin-lead plating needs, and elimination of tin-lead stripping steps and processing of the stripped tin-lead. As compared to known processes which similarly seek to avoid non-selective tin-lead plating, the present invention provides considerable improvement in process simplicity.

In the preferred process of the invention, and with reference to the selective provision of tin-lead coating, a copper foil clad printed circuit substrate has through-holes drilled therein, and the through-holes are then metallized with electroless copper (at the same time providing electroless copper over the copper foil cladding). A photoresist coating is then applied, exposed and developed to provide a pattern of plating resist in the negative of the desired copper circuitry, and the non-resist covered areas (holes and areas which will serve as traces, pads and surface mount areas) are then provided with additional copper thickness, usually by electroplated copper. With the plating resist still in place, a negative-working, photoimageable, electrophoretically depositable organic resin is deposited by electrophoresis. Because of its electrophoretic nature, the resin is deposited only on the conductive copper surfaces (holes, pads, traces, surface mount areas) and not over the previously applied plating resist. The so-deposited layer is then imagewise exposed and developed to expose only those areas which are to receive tin-lead (holes, pads, surface mount areas) while covering other conductive areas (not covered by the plating resist) which are not to receive tin-lead (traces). By its negative-working nature, the resin is readily removable from holes without need for directing activating radiation into the hole areas. Thereafter, the remaining exposed copper areas are selectively electroplated with tin-lead. The plating resist is then removed, and the copper thereunder is etched away down to the substrate surface. In the etching, the tin-lead coating on the holes, pads and surface mount areas there serves as an etch resist, while the electrophoretically deposited resin on the traces serves to protect those areas from etching. After the copper etching, the electrophoretically deposited resist is removed, solder mask is applied over all areas other than holes, pads and surface mount areas, and the tin-lead over those areas can then be reflowed and fused to provide the requisite solder coating thereat.

The invention is further described and illustrated with reference to the following detailed description and accompanying figures.

DETAILED DESCRIPTION OF THE INVENTION

The invention is generally applicable to any printed circuit which contains metallized through holes, and which requires that the solderability of areas such as holes, pads and surface mount areas be preserved and enhanced by application thereto of solderable coating, preferably electroplated tin-lead alloy, and which also requires that, in the solder masking of all areas which are not involved in later solder connections, any metal areas under the solder mask be non-reflowable, e.g., bare copper. The invention is thus applicable to double-sided printed circuits as well as multilayer printed circuits (i.e., circuits formed from an alternating layered arrangement of circuitry innerlayers sandwiched between dielectric substrate material).

In the following discussion with reference to the Figures, the invention is illustrated with reference to a typical double-sided printed circuit. For ease of description, the provision of the required circuitry is shown only with respect to one side of the board. The sectional views are greatly simplified and expanded for ease of understanding and illustration, and the thicknesses for the various metal and resist layers are not in absolute or even relative proportions.

Figure 1A:
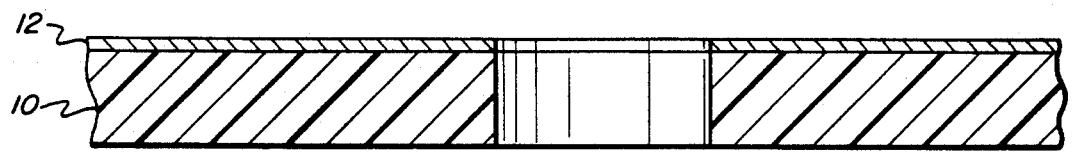
FIGS. 1A through 1L, are cross-sectional views of a portion of a printed circuit board at various stages of processing in accordance with the invention.

The first step in the process is the provision of a printed circuit insulating substrate material having one or more through holes drilled or punched therein at desired locations. As shown in FIG. 1A, the preferred starting material is a dielectric substrate 10 (e.g., epoxy, polyimide or other like thermosetting or thermoplastic resin, optionally and preferably reinforced with, e.g., glass fibers) on which already has been provided a copper foil 12 bonded to its surfaces and which is then provided with through holes. Typical copper foil cladding 12 is one ounce copper, i.e., copper foil of a nominal thickness of about 0.0014 inches. Alternatively, however, the starting material can be the dielectric substrate 10 per se with through holes provided therein.

Figure 1B:
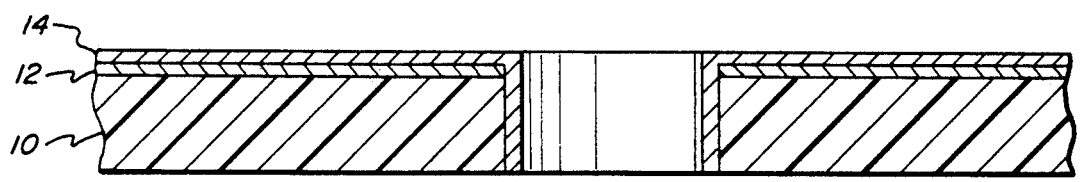

The next step in the process is the metallization of the through hole surfaces to provide the structure shown in FIG. 1B wherein a copper layer 14 is provided over the through hole surfaces and over the copper foil cladding 12. The metallization is preferably by way of electroless copper deposition and will include the well known preparatory step of catalytic activation of the surfaces with, e.g., palladium-tin sols or solutions, prior to immersion of the board in the electroless copper depositing bath. For multilayer circuits, the through hole metallization process will also generally include steps for desmearing and/or etching back the through holes prior to catalytic activation, and for all circuits the preparation will generally also include various cleaning, glass fiber etching, conditioning, microetching and other steps before activation and electroless copper deposition. All these techniques are well known in the art and are not further elaborated upon herein; the only feature of importance to the inventive process is simply the provision of metallized through holes.

Figure 1C:
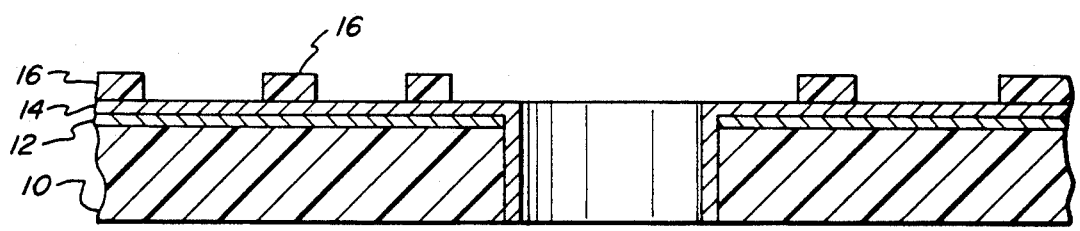

In the next process step, the board with metallized through holes is then subjected to photoimaging to produce on the surfaces a pattern of organic resist material 16 (FIG. 1C) which is in the negative of the pattern of eventually desired metal circuitry. The resist pattern is arrived at by the deposition, imagewise exposure and development of any suitable photoresist composition. Most preferred in this regard is the use of a dry film photoresist which is applied as a layer over the entire surface (thus, tenting over the through holes) and is then exposed to activating radiation of appropriate wavelength through a patterned mask, and developed in an appropriate solvent, to leave behind the desired pattern of resist 16. Another requirement of the resist, as will become apparent from later discussion herein, is that it be eventually strippable by means which would not also strip the other resist used in the process (see FIG. 1I). To this end, it is preferred that the resist 16 be strippable in aqueous alkaline solution.

Figure 1D:
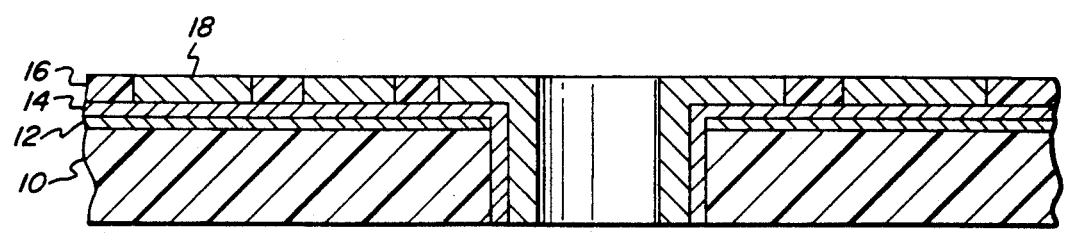

Following production of the desired pattern of resist 16 (hereinafter referred to as the primary plating resist), the areas not covered by the resist are provided with additional copper thickness, typically by means of electroplating. In this manner, only the areas where conductive circuitry will exist are built up with an additional layer of copper 18 as shown in FIG. 1D. The total thickness of copper to be built up in this manner is dictated simply by the electrical requirements of the final circuit, and can be varied in any suitable manner.

Figure 1E:
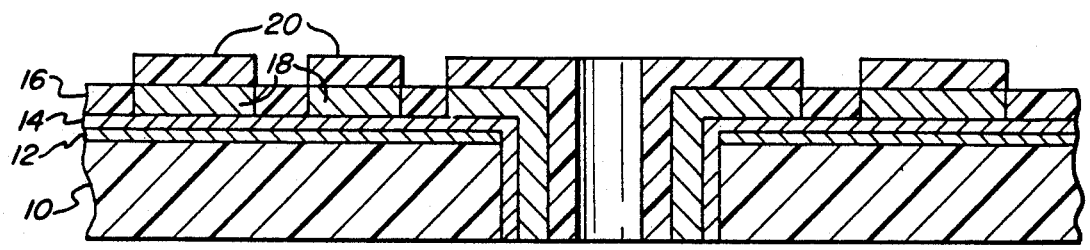

In the next step of the process, a photoimageable, electrophoretically depositable organic resin is then electrophoretically applied to the board. By virtue of the charged nature of the resin and the electrophoretic deposition process, the photoimageable organic resin so applied will be applied only to those areas which are conductive, and thus not on areas protected by the primary plating resist or on the primary plating resist per se, all as shown in FIG. 1E.

The use of electrophoretically depositable organic coatings in selective metallization processes, selective etching processes and printed circuit manufacture is known in the art, as are the processes for effecting the deposition and the organic compositions for use therein. In these regards, reference should be had to USSR Inventor's Certificate No. 293,312 (published May 10, 1971); British Pat. No. 1,194,826 (published Jun. 10, 1970); French patent application No. 2,422,732; and U.S. Pat. Nos. 3,892,646; 4,592,816; 4,746,399; 4,751,172; and 4,861,438, and the references cited therein, all of which are incorporated by reference herein, particularly as regards photoimageable, electrophoretically depositable organic resins.

In general, the electrophoretic deposition is carried out in a cell containing a solution or suspension of the organic resin, and most typically the copper surfaces of the board serve as the cathode in the cell (positively-charged organic resin). The temperature at which the electrophoretic deposition is carried out generally will be between about 70° F. to about 100° F., and the voltage typically will be in the range of from about 20 to about 300 volts. The electrophoretic deposition of the organic resin continues until the desired thickness of resin is obtained. Generally, the deposited thickness will be on the order of from about 0.2 to about 2.0 mil depending upon the type of circuitry involved, but any optimal or desired thickness can be employed.

Following the electrophoretic deposition, the photosensitive resin so deposited is imaged and developed to provide the resin as a patterned resist 20 only over those conductive areas (e.g., traces) which are not to be provided with the readily solderable coating according to later steps of the invention. To this end, the photosensitive electrodeposited organic resin is chosen to be a negative-working composition, such that areas exposed to activating radiation in the imagewise exposure step become insoluble (or at least differentially less soluble than unexposed areas) in the subsequently employed developer. In this way, resin deposited over the conductive through hole surfaces can be readily rinsed away in development without need for having been exposed to activating radiation in the imagewise exposure step.

Figure 1F:
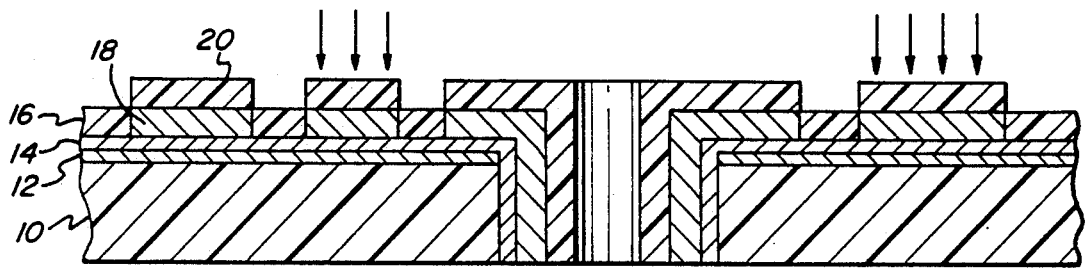
Figure 1G:
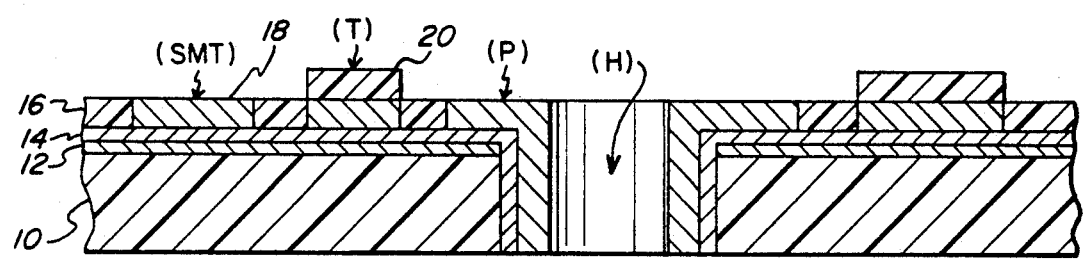

These steps are illustrated in FIG. 1E where the resin layer 20 is electrophoretically deposited over all conductive surfaces; FIG. 1F where the layer is selectively imagewise exposed through a patterned mask; and FIG. 1G wherein the development step results in the light-exposed areas remaining as resist 20.

As will readily be seen, the foregoing steps serve to leave exposed only those conductive areas (here, through holes (H), surrounding pads (P) and surface mount areas (SMT)) where readily solderable surfaces are to be provided, while all other areas are protected from plating by virtue of resist 20 (for copper areas which will become copper traces (T)) and primary plating resist 16 (for copper areas which will eventually be etched away).

Figure 1H:
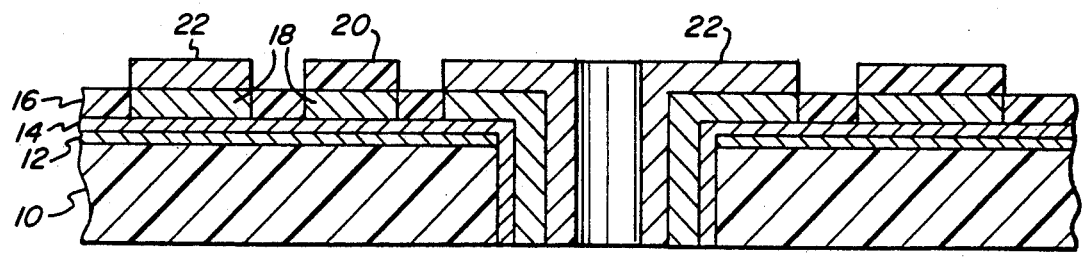

With the circuit so patterned, the exposed copper hole, pad and surface mount areas are then provided with a metal coating which will preserve and promote solderability of electrical components thereat, preferably a layer of tin-lead 22 applied by electroplating, as shown in FIG. 1H. The layer of tin-lead 22 can be of any desired and necessary thickness, and typically will be on the order of about 0.3 to about 0.7 mil thick.

Figure 1I:
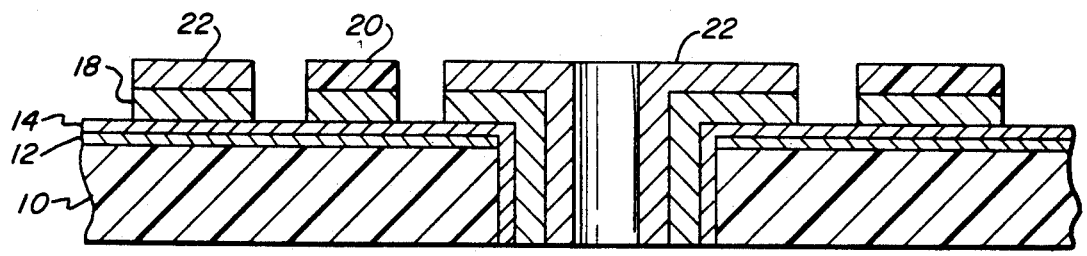

Following tin-lead plating, primary plating resist 16 is then stripped from the copper surfaces (12, 14) over which it exists (FIG. 1I). Having been chosen for its strippability in a medium which does not also strip resist 20 (e.g., aqueous alkaline medium), resist 16 can be selectively stripped while resist 20 remains intact.

Figure 1J:
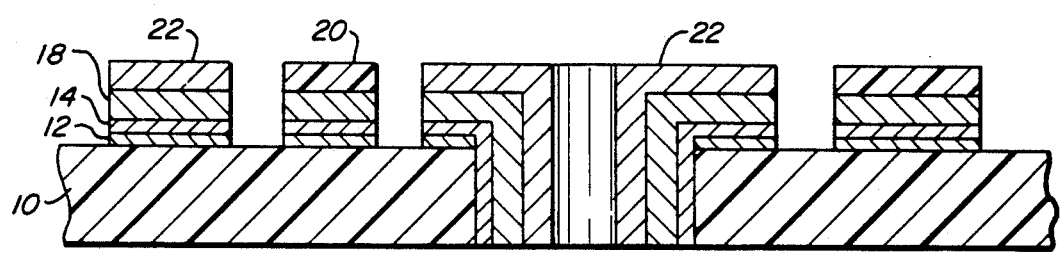

After stripping primary plating resist 16, the copper thereunder is etched away down to the substrate surface by any suitable means effective to etch copper without appreciably dissolving tin-lead, with ammonia-based etching solutions being preferred. In the etching process, tin-lead layer 22 serves as an etch-resist for the through-hole, pad and surface mount areas, while the electrophoretically deposited resist 20 serves as an etch resist for the copper trace areas thereunder, all as shown in FIG. 1J.

Figure 1K:
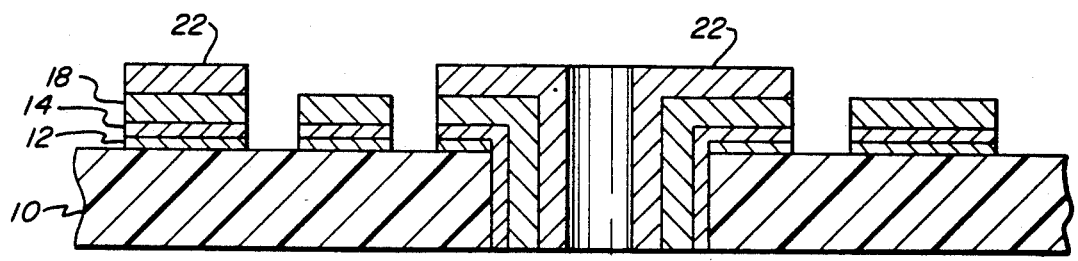
Figure 1L:
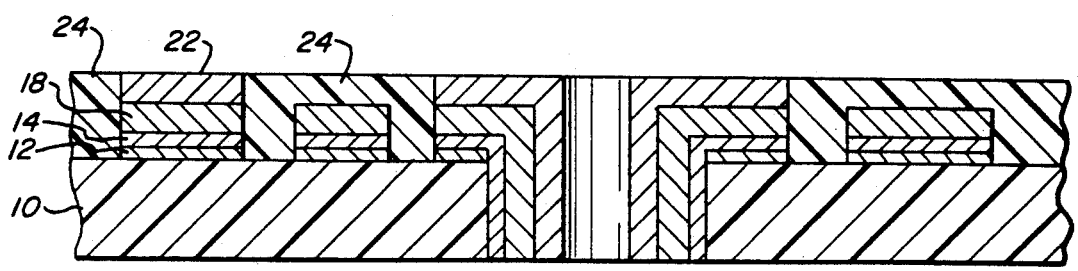

Following copper etching, the electrophoretically deposited resist 20 is stripped using any suitable medium therefor, leaving the structure shown in FIG. 1K. Thereafter, all areas other than holes, pads and surface mount areas are provided with a suitable solder mask 24 by any appropriate application technique (FIG. 1L). At this stage, then, the board is ready for the later soldering of electrical components at hole, pad and surface mount areas. Typically, the tin-lead layer 22 will be reflowed and fused in the printed circuit fabrication stage prior to the assembly of electrical components thereto.

As will be well appreciated by those in this art, the foregoing sequence is for illustration of only the essential steps of the invention, and does not illustrate the various rinses, surface preparation steps, etc., which are commonly employed in association with plating steps, resist deposition steps, etching steps, etc. It should be understood that the reference herein to various copper surfaces refers only to the gross structure of the particular surface in question, in that it may be pure copper or suitable copper alloy, or even have a further coating thereover. In particular in this regard, it is intended and contemplated that the foregoing process sequence might also include the provision of a further surface coating over copper surfaces at various stages in the process as a means for enhancing a subsequent process step. By way of example, it is contemplated that copper surfaces over which electrophoretically depositable resins are deposited by electrophoresis will first be provided with a uniform layer of a uniformizing/passivating component, such as copper oxide, phosphate or the like, as a means for enhancing deposition, imaging, development and functional properties of the electrophoretically deposited resin, as is described in commonly-assigned application Ser. Nos. 07/710,707, 07/710,666 and 07/710,665, all filed on even date herewith.

By virtue of the present invention, there is provided a straightforward means for providing a printed circuit in which the areas where solder connections of electrical components are to be made are arranged to be (and remain) readily solderable, e.g., via provision of tin-lead plating thereat, without need for tin-lead plating and subsequent tin-lead stripping at other areas, and in a way which simplifies the overall process and materials requirements. It will be appreciated that the foregoing description is used in illustration of the inventive process and its preferred mode of operation, and that other variations and modifications are possible within the scope and spirit of the invention, as defined in the appended claims.

What is claimed is:

1. A process for fabricating a printed circuit in which selected conductive areas, including through-holes and surrounding pads, are selectively provided with a solderable metal coating which maintains and promotes the solderability of electrical components thereat, said process comprising the steps of:
   (a) providing a printed circuit material comprised of a metallized insulating substrate material having through-holes formed therein;
   (b) metallizing the surfaces of said through-holes;

(c) providing on said printed circuit material a primary plating resist in the negative of the pattern of desired conductive circuitry of said printed circuit;

(d) thereafter providing additional metal over those metallized areas of the printed circuit material not covered by said primary plating resist;

(e) thereafter selectively electrophoretically applying, over those areas of said printed circuit material provided with said additional metal, a photoimageable electrophoretically depositable organic resin;

(f) thereafter imagewise exposing and developing said photoimageable electrophoretically applied resin to provide a pattern of a second resist on said printed circuit material, said pattern of said second resist being such that, of all conductive areas, only the selected conductive areas, including through-holes and surrounding pads, which are to be provided with a solderable metal coating, remain exposed;

(g) thereafter selectively providing a solderable metal coating only on said exposed conductive areas;

(h) thereafter selectively removing said primary plating resist from said printed circuit material;

(i) thereafter etching away metal which was under said primary plating resist; and (j) thereafter removing said second resist from said printed circuit material.

2. A process according to claim 1, further comprising the step, after step (j), of providing areas of said printed circuit material, other than those selected areas having said solderable metal coating thereon, with a solder mask.

3. A process according to claim 1 wherein said solderable metal coating is electroplated tin-lead alloy.

4. A process according to claim 3 wherein said metallizing of said through-holes is by electroless copper deposition.

5. A process according to claim 4 wherein the providing of additional metal of step (d) comprises electroplating copper over said metallized areas.

6. A process according to claim 1 wherein said plating resist of step (c) is provided by the application, imagewise exposure and development of a photoresist.

7. A process according to claim 6 wherein said photoresist is a dry-film photoresist.

8. A process according to claim 1 wherein said photoimageable electrophoretically depositable organic resin is negative-working.

9. A process for fabricating a printed circuit in which selected conductive areas, including through-holes and surrounding pads, are selectively provided with a tin-lead coating to preserve and promote the solderability of said areas, comprising the sequential steps of:

(a) providing a printed circuit material comprised of an insulating substrate material coated on its outerfacing planar surfaces with copper and having one or more through-holes provided therein;

(b) electrolessly providing a layer of copper over said copper coating and said through-hole surfaces;

(c) providing over said electroless copper a primary plating resist in the negative of the pattern of the desired conductive circuitry of said printed circuit;

(d) electroplating copper over the electroless copper areas, including through-holes and surrounding pads, not covered by said primary plating resist;

(e) selectively electrophoretically depositing over the electroplated copper areas a negative-working photoimageable electrophoretically depositable organic resin;

(f) imagewise exposing and developing said organic resist to provide a second resist in a pattern such that only those electroplated copper areas, including through-holes and surrounding pads, which are to receive said tin-lead coating, are exposed;

(g) selectively electroplating tin-lead over said exposed electroplated copper areas, including through-holes and pads;

(h) selectively removing said primary plating resist;

(i) selectively etching away the copper previously under said primary plating resist;

(j) removing said second resist; and (k) solder masking areas of said printed circuit not having said tin-lead coating thereon.

* * * * *